July 4, 1950

C. F. FREY, JR., ET AL 2,513,393

HIGH-FREQUENCY TUNER DEVICE

Filed March 29, 1949

INVENTORS
Cleon F. Frey, Jr.
BY Robert J. Aust

Nicholas Lang[illegible]
ATTORNEY

Patented July 4, 1950 2,513,393

UNITED STATES PATENT OFFICE 2,513,393

HIGH-FREQUENCY TUNER DEVICE

Cleon F. Frey, Jr., Greenfield, and Robert J. Aust, Indianapolis, Ind., assignors to P. R. Mallory & Co., Inc., Indianapolis, Ind., a corporation of Delaware Application March 29, 1949, Serial No. 84,222

14 Claims. (Cl. 250—40)

This invention relates to a tuner and particularly to one of the type suitable for high frequency electromagnetic carrier wave signals in the megacycle range.

Heretofore, attempts have been made to tune television receivers and receivers of the frequency modulation type by adjusting the capacitance and inductance of resonant circuits. This arrangement is not particularly suitable for tuning high frequency circuits operating in the megacycle range since for slight changes for frequency the inductance effect of the concerned components of the electrical circuits becomes a predominating factor.

Also, television receivers and receivers of the frequency modulation type have been tuned to any selected video or broadcast channel or station by the selective switching of either an inductance or capacitance, or both into a circuit or circuits to be resonated. Provision for vernier tuning of each channel was made by having a separate trimmer control disconnected from the conventional video channel selector. Therefore, it can be realized that a compact tuner for either television or high frequency electromagnetic carrier wave signals was unattainable heretofore. Further, satisfactory vernier tuning of the above mentioned receivers by the operators thereof really did not exist since the trimmer controls were usually placed either in the rear of the receivers or within the chassis thereof for manipulation by servicemen or skilled technicians at the factory where these receivers were built or assembled.

The ideal manner of tuning either a television receiver or an FM receiver would involve changing only the inductance of the resonated circuits. In connection with the tuning of a television receiver operating under the present distributive arrangement of carrier wave channels a substantial band spread of frequency is found between one group of channels and another. For instance, channel 7 is designated as operating at a frequency of 176 megacycles while channel 6 operates at a frequency of 88 megacycles, thus producing a so-called "dead" range of 88 megacycles. Heretofore, known tuners could not skip this so-called "dead" range without the use of conventional switching.

Therefore, a primary feature of this invention is the elimination of the inadequacies of prior high frequency tuners.

A further object of the present invention is to provide a compact tuner adapted for linear tuning of circuits operating on frequencies in the megacycle range.

Another object of this invention is to provide a tuner adapted for tuning a high frequency circuit operating on a band of frequencies in which one group thereof is widely separated from another group by a so-called "dead" range.

An additional important object of this invention is to provide a tuner for high frequency signals in which a vernier effect is provided when the tuner is being used on either the high or lower ranges of said high frequency signals.

A further object of this invention is to provide a tuner in which the effect of an absorption device is augmented by the vernier effect produced by slight changes in an inductance which may have the form of a metallic strip.

Another object of this invention is to provide a tuner in which an inductance is given such form as to provide linear tuning of a circuit operating at least within about the region of 100 megacycles.

An important object of the present invention is to provide a high frequency tuner adaptable either for television receivers or receivers of the frequency modulation type.

A further object of the invention is to provide a tuner in which an adjustably shaded single coil is so arranged with a conductor that the coil may be used for rough tuning in predetermined positions of a shading means and for fine tuning in other predetermined positions thereof, the fine tuning being also augmented by a vernier effect of said conductor.

An important object of this invention is to provide a tuner having both coarse and fine tuning, the fine tuning being effectively divided into two forms thereof.

Another object of this invention is to provide a high frequency tuner with accurately aligned components.

Other objects of the invention will be apparent from the following description and accompanying drawings taken in connection with the appended claims.

The invention accordingly comprises the features of construction, combination of elements, arrangement of parts, and methods of manufacture referred to above or which will be brought out and exemplified in the disclosure hereinafter set forth, including the illustrations in the drawings, the scope of the invention being indicated in the appended claims.

For a fuller understanding of the nature and objects of the invention as well as for specific fulfillment thereof, reference should be had to the following detailed description taken in connection with the accompanying drawings, in which.

Figure 1:
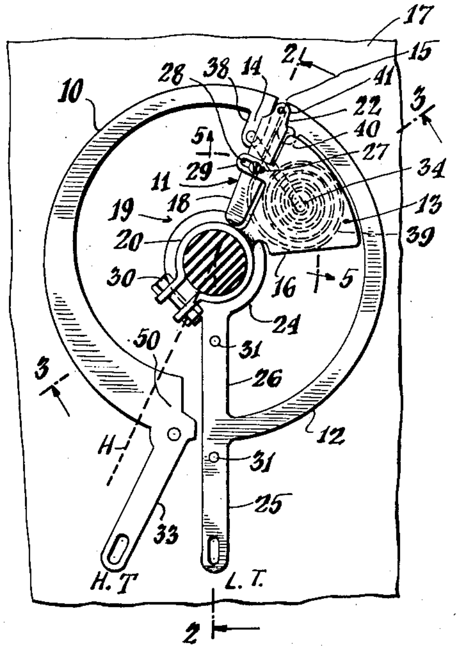
Figure 1 is a front view of one embodiment of a tuner mounted on a base member in accordance with the present invention.
Figure 2:
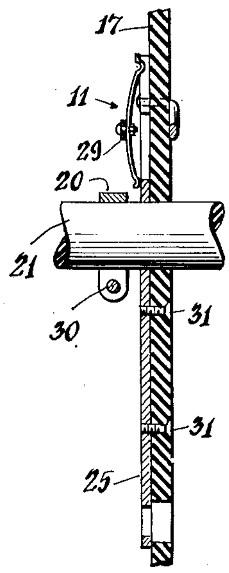
Figure 2 is a section along the line 2—2 of the tuner shown in Figure 1.
Figure 3:
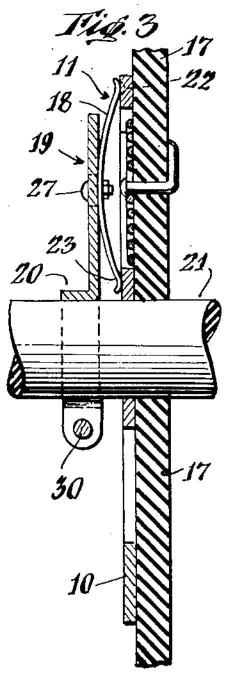
Figure 3 is another section along the line 3—3 of the tuner shown in Figure 1.
Figures 5, 6:
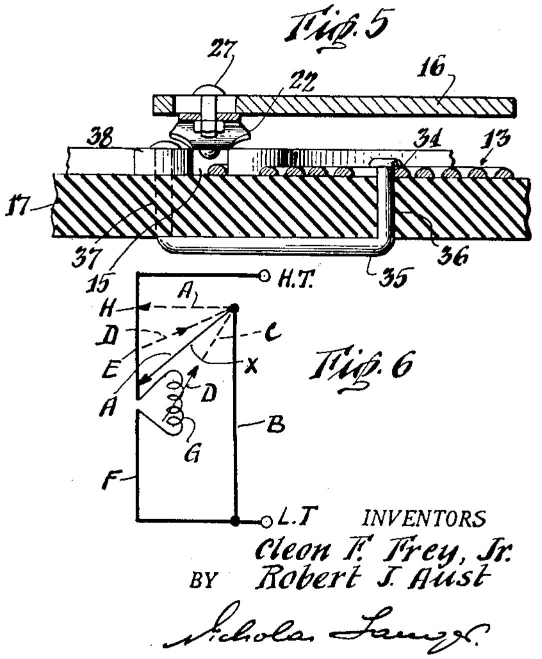

Figure 5 is a section along the line 5—5 of the tuner, Figure 1 showing in an enlarged fragmentary view the details of the shading coil blade correlated with the bridging portion of a contactor, and of the connection between a lumped inductance in the form of a spiral coil and at least two other inductances in segmental form; and Figure 6 is a schematic of the electrical circuit of the tuner shown in the above figures.

According to one phase of this invention a tuner for high frequency application such as in a television receiver or a receiver of the frequency modulation type, comprises a conductor or metallic segment of tapered form which is contacted by a slidable contactor for the purpose of continuously varying the frequency of a receiver in a linear fashion over a considerable range of frequencies such as, for instance, between the limits of 176 megacycles to 216 megacycles. This tuning action takes place without any intermediate switch action of the contactor.

In another phase of this invention a tuner for a television receiver or similar device operating on high frequency contemplates the use of a fixed coil such as a spirally wound coil interposed between the above named segment and another segment preferably having a uniform cross section. This coil acts as a lumped inductance for facilitating the bridging of a so-called "dead" range in the present television broadcast channels or, for that matter, any "dead" range within any type of broadcast system. In still another phase of this invention a shading coil means is provided whereby, when it is properly oriented with a contact and said segments, the tuning transition from the television channels corresponding to the high band group of frequencies to the channels corresponding to the low band group of frequencies may be made with a minimum movement of the contact while accomplishing coarse tuning of the low band channel nearest said transition. The shading coil means acts both as coarse and fine tuning means for each channel selected in the low band group, dependent upon the degree of off-tune produced by the initial setting of said means for the selected channel, the uniform segment acting as an additional and more fine vernier. When the comparatively low band end of the low band frequency group is concerned, the coarse tuning produced by the shading means is minimized. Continuous tuning of both the low and high band groups of high frequency channels is obtained by the present invention.

Broadly stated with reference to Figures 1–5, the tuner for a circuit to be resonated in response to signals from a radiant energy source transmitting at least two frequency spaced groups of signals, each group representing a number of channels, comprises means including at least one tapered conductor or segment 10 and a contactor 11 for continuously and linearly tuning this circuit to a relatively high frequency band of signals in one channel group. This tuner also contains additional means including a conductor or segment 12 contactable by the contactor 11 and a coil 13 coupled to a low frequency portion 14 of the tapered conductor 10 for tuning the circuit to a relatively low frequency band of signals in the other channel group. The conductors 10 and 12 are separated by an air gap 15 correlated with a "dead" range of signals producing the spaced groups of channels.

The additional means associated with a low band side tuning of the tuner includes an eddy current blade 16 connected to the contactor 11. This means is so constructed and arranged that the coil 13 is shaded to produce maximum eddy currents in the blade 16 during the interval of changing the operating characteristics of the circuit required from one channel group to another, one channel group being specifically frequencies between 176 megacycles to 216 megacylces while the other group corresponds to frequencies between 88 and 44 megacycles. However, it should be understood that the concept of this invention is not to be limited to the broadcast channels given above or the named frequencies associated with each of the segments or sectors such as 10 and 12, vernier tuning on lowest channels is avoided.

The contactor 11 comprises an arched metallic spring 18 adjustably bolted to a frame member 19 containing a C-clamped portion 20 surrounding an insulative shaft 21 inserted through a central opening 8 of the base member 17. The outer end of the spring 18 contains a semi-ball shaped contact 22 of such dimensions as to bridge the air gap 15 when it is desired to transfer the contactor 18 from segment 10 to segment 12 or vice versa. The inner end of the spring-like contact 18 is also formed in a manner similar to the contact 22 for slidably engaging a central contact ring 24 mounted on the base 17 and connected to a terminal member 25 of the conductor 12 through a conductive strip 26. A bolt and nut 27 connects the spring 18 to the rotatable frame 19 to provide lateral adjustment to the contactor 11 relative to the shading coil blade 16. Also it will be noted that the blade 16 may be adjusted angularly with respect to the contactor 11 by virtue of the slot 28 within a protruding portion 29 of the blade 16. Of course such angular adjustment cannot take place until the bolt 30 on the C-clamp 20 as well as the bolt and nut 27 is loosened.

The means for holding the segments 10 and 12 to the insulative base member 17 are shown as screws 31 threaded into the base member and selected portions of the respective segments. In the present invention the connection between the inner end 34 of coil 13 and the low band end 14 of the tuning strip 10 is made by a separate conductor 35 carried through an opening 36 of the base member 17 across the back of the coil 13 and then led through another opening 37 in the same base member for connection to an inwardly protruding lug 38 of conductor 10. The outer turn 39 of the coil 13 can be similarly connected to the inwardly protruding portion 40 adjacent the high band end 41 of segment 12.

Segments 10 and 12 with their terminals 25 and 33 may be stamped from a single sheet of metal, severable webs of thin material connecting the segments being left so as to make it easy to align the segments with the printed coil 13 on the base 17. After the segments 10 and 12 are fastened to the base 17 by screws 31, the webs may be severed. The ring 24 and connective strip 26 may also be formed integral with segments 10 and 12. It is also within the purview of this invention to stamp and adhere the segments 10 and 12 with connective terminals and strips to the base 17 in one machine operation. However, the preferred method of forming the above mentioned segments, strips, rings, etc. is by printing them directly on the ceramic base 17.

Figure 4:
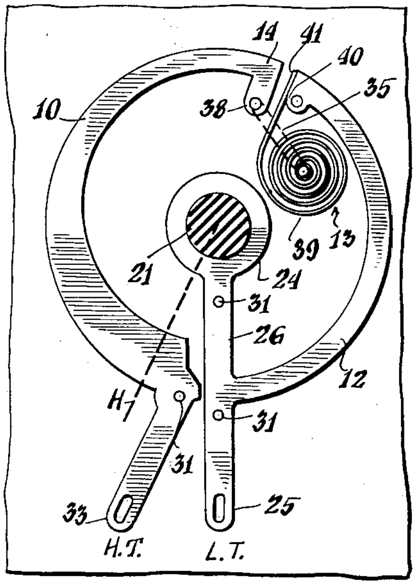
Figure 4 is a front view of the tuner devoid of the movable elements thereof.

Referring to Figure 6 of the drawing, the electrical circuit of the tuner of the subject invention is shown schematically so as to more easily demonstrate the novelty of the present tuner from the electrical viewpoint only. In Figures 1 and 4 the terminal means 25 and 33 are labeled respectively "L. T." for low terminal and "H. T." for high terminal and this marking is followed in Figure 6. In Figure 6 an arrow A in a continuous line corresponds to the contactor 11 in its present position in Figure 1. It will be noted that segment 12 is shunted by the contactor 11 corresponding to said element A of Figure 6 through the connection labeled B to the L. T. side of the tuner. The connection B corresponds to the combination of ring 24, terminal 25 and the connective strip 26 interconnecting the two. In Figure 6 the mechanical connection between the shielding means 16 and the contactor 11 is shown by the dotted line C connected to the solid arrow D corresponding to the absorption blade or eddy current blade 16. The angle between the joined center lines of contactor 11 and blade 16 respectively is indicated as X in Figure 6. The segment 10 is marked E and the segment 12 is marked F, both being interconnected by the coil 13 labeled G in the electrical circuit.

In the operation of the novel high frequency tuner band spreading may be involved, but in one version of this invention it may not. The condition is taken in which it is desired to tune a television receiver to channel 13 corresponding approximately to a position of the contactor 11 by the dotted line H of Figure 1 and to the H position of the contactor A in Figure 6. Since channel 13 represents a frequency of 216 megacycles, very little or perhaps none of the length of the segment will be required to tune the television receiver if the length of the terminal means 33 and 25, and also including the connective means 24 and 26 to the contactor 11 is such as to produce the proper matching inductance and capacitance of the circuit to be resonated at that frequency. However, for the present showing, some length of the segment 10 is included in the electrical circuit operating on channel 13. Let us suppose that the operator wishes to tune the receiver to some lower frequency. He would turn the shaft 21 in a clockwise direction from the first position marked H to some pre-selected point on the high band segment 10. This predetermined point is reached very easily since the contour or the cross sectional shape of the segment 10 from the high band end marked 50 to the low band end 14 is such that for a linear movement of the contactor 11 a linear change in the frequency of the resonated circuit in the television receiver is produced. It is to be pointed out at this time that while the segment 10 is shown as approximately a half-ring, it may assume a different form and be of such length that linear tuning of high frequencies may extend over a wider band of frequencies than that heretofore indicated. Segment 10 may also be constructed for non-linear tuning. It may be said that the frequency tuning range would be limited by feasible commercial structures in which the factor of minimum lead length is attained. The concept for one phase of this invention, therefore, is to produce linear tuning of a high frequency circuit in the manner given above.

Assuming now that it is desired to tune the television receiver to channel "6", corresponding to a frequency of 88 megacycles, which related to the tuner structure would be located near the high band portion 41 of the low band segment 12, very close to air gap 15. For practical purposes channel "7" is indicated on the left side of the air gap 15 and channel "6" is on the right side of the same air gap. Therefore, in order to switch from channel "7" to channel "6", a limited movement of the contactor 11 determined by the width of the air gap 15 is required. Looking at Figure 1, the contactor shows contact 22 bridging the air gap 15 and also shows the spiral coil 13 shaded by blade 16. The blade 16 and the contactor 11 are so oriented with respect to each other that when the contact 22 is about to transfer its contact from segment 10 to segment 12, the inductance of the coil 13 will simultaneously undergo a maximum change and thereby facilitate a transition of tuning of the television receiver from channel "7" to channel "6" with a very small movement of the shading blade 16 and of the associated contactor 11. Continued movement of the shaft 21 in a clockwise direction through a predetermined angle produces a vernier tuning action of the contact 22 in slidable contact with the segment 12 because a portion of the length thereof is now in series with the coil 13, the remaining portion of the segment 12 being shunted in the manner described heretofore for the position of the contactor 11 in Figure 1. Still further movement of the shading blade 16 clockwise will make it possible to tune the television receiver to the low band end of the channels corresponding to the channels "6 to 2". The locations of the lower channels are dependent a great deal upon the specific form of the shading blade 16 and upon the size and location of the spiral coil 13 with respect thereto shown by the angle X of Figure 6, and with respect to the low band tuning segment 12. However, it can be recognized that linear tuning may be accomplished by the proper design of the shading blade 16 and the correlated lumped inductance 13.

From the present invention a compact, simple, and inexpensive television tuner of reliable construction is indicated since but one coil 13 representing a lumped inductance can be printed, stamped, or otherwise formed upon an insulative backing member and strip conductors of predetermined form can be stamped on this backing or preformed for mounting thereto with the proper orientation with respect to the flat or pancake type coil. The fixed parts of the tuner can be produced in a manner particularly suitable for mass production. It is recognized that the art of printing a coil on an insulative base is old as well as the forming of a stamped conductor. However, the particular organization of a high frequency tuning segment constructed for continuous or switchless linear tuning with or without a segment suitable for relatively low band tuning wherein the latter is used as a vernier is novel in every phase thereof. The means for contacting both the high and low frequency segments of the tuner are also of very simple construction and taken in connection with the novel tuning transition means including the shading blade disclose another important phase of the invention.

While the present invention, as to its objects and advantages, has been described herein as carried out in specific embodiments thereof, it is not desired to be limited thereby but it is intended to cover the invention broadly within the spirit and scope of the appended claims.

What is claimed is:

1. A tuner for high frequency signals covering a substantial band comprising a lumped inductance, at least one inductance in strip form coupled thereto, means including a movable contactor for conducting said signals to said inductances, and shading means coupled to said contactor and so constructed and arranged with respect to said lumped inductance that for a contact position of said contactor contiguous to said coupling of said inductances the absorption effect of said shading means on said lumped inductance is very high, continued movement of said contactor away from said lumped inductance and in contact with said distributed inductance causing a gradually increasing inductive effect of said lumped inductance sensitively to be augmented by that portion of said strip inductance increasingly included with said lumped inductance.

2. A tuner for high frequency signals covering a substantial band comprising a lumped inductance, at least one distributed inductance coupled thereto, means including a movable contactor for conducting said signals to said inductances, and shading means coupled to said contactor and so constructed and arranged with respect to said lumped inductance that for a contact position of said contactor contiguous to said coupling of said inductances the absorption effect of said shading means on said lumped inductance is a maximum, continued movement of said contactor away from said lumped inductance and in contact with said distributed inductance causing a gradually increasing inductive effect of said lumped inductance sensitively to be augmented by that portion of said distributed inductance increasingly included with said lumped inductance.

3. A tuner for a circuit to be resonated in response to signals from a radiant energy source transmitting at least two separated groups of frequency signals, each group representing a number of channels carrying at least video signals, comprising means including at least one tapered conductor and a contactor for continuously and linearly tuning said circuit to a relatively high frequency band of signals in one said channel group; and additional means including both a conductor contactable by said contactor and a coil coupled to a low frequency portion of said tapered conductor for tuning said circuit to a relatively low frequency band of signals in the other channel group, said conductors being separated by an air gap correlated with a dead range of signals producing said groups of channels, said additional means including an eddy current blade coupled to said contactor and so constructed and arranged that said coil is shaded to produce substantial eddy currents in said blade during the interval of changing the operating characteristics of said circuit required from one channel group to another.

4. A tuner comprising a first conductor having one end thereof adapted to be connected to a source of radiant energy, said conductor having a surface of tapering form from said end to an opposite end, a spiral winding having one end thereof coupled to an opposite end of said conductor, a second conductor having one end coupled to an opposite end of said spiral, rotatable means having a portion for electrically contacting said first and second conductors, shading means coupled to said portion of said rotatable means, said shading means being so constructed and arranged with respect to said conductors and rotatable means that a maximum effect of said shading means upon the inductance of said spiral winding is produced simultaneously with the transfer of contact of said portion from said first conductor to said second conductor, and means coupling said portion of the rotatable means and a free end portion of said second conductor to said source of energy.

5. A tuner adapted for a circuit operating on a wide band of high frequency electromagnetic signal waves comprising a fixed conductor of angular form, a fixed curved conductor spaced from said conductor, said conductors forming a substantially enclosed area, a lumped inductance fixedly interposed between said conductors, and means including a combined rotatable contactor and an absorption arrangement adapted to affect said lumped inductance and for changing the inductance of said conductors during the rotation of said contactor, said contactor when in contact with said curved conductor acting as a vernier during the time said absorption arrangement is effectively coupled to said lumped inductance.

6. A tuner for high frequency signals covering a substantial band comprising a lumped inductance, a distributed inductance coupled thereto, means including a movable contactor for conducting said signals to said inductances, shading means coupled to said contactor and so constructed and arranged with respect to said lumped inductance that for a contact position of said contactor contiguous to said coupling of said inductances the absorption effect of said shading means on said lumped inductance is a maximum, movement of said contactor away from said lumped inductance and in contact with said distributed inductance causing a gradually increasing inductive effect of said lumped inductance sensitively to be augmented by that portion of said distributed inductance included with said lumped inductance, and means for adjusting said shading means relative to said lumped inductance and said contactor whereby signal tracking is facilitated.

7. A tuner comprising a high-frequency-band sector of tapered form, a low frequency band sector of uniform cross section, said sectors being arranged to form a substantially closed area, the directly opposed ends of said sectors adjacent the lower frequency portion of said tapered sector being separated a predetermined distance correlated with the so-called "dead" range in broadcast channels, a coil interconnecting said opposed ends, terminal means for connecting the remaining end of each of said sectors to a source of radiant energy, means including a rotatable contactor for providing a shunt path around at least a portion of said interconnected sectors dependent on the position of said contactor, and a shading coil blade coupled to said contactor and so constructed and arranged with respect thereto and said coil that a tuning transition through said "dead" range is obtained when said contactor is substantially transferred from one of said sectors to another.

8. A tuner comprising a first flat metallic member having one end thereof adapted to be connected to a source of radiant energy, said member having a diminishing cross section from said end to an opposite end, a printed flat winding having one end thereof coupled to said opposite end of the sector, a second flat metallic sector having one end coupled to an opposite end of said winding, rotatable means including an adjustable contact for slidably engaging said first and second sectors, shading means coupled to said rotatable means, said shading means being so constructed and arranged with respect to said sectors and rotatable means that a maximum effect of said shading means upon the inductance of said winding is produced simultaneously with the effective transfer of contacting action of said rotatable means from said first sector to said second sector, and means coupling said rotatable means and a free end portion of said second sector to said source of energy.

9. A tuner comprising a first metallic sector having one end thereof adapted to be connected to a source of radiant energy, said sector having a surface of tapering form from said end to an opposite end, a spiral winding having one end thereof coupled to said opposite end of said sector, means for contacting said first and second sectors, means for effecting relative movement between said contacting means and said sectors, shading means coupled to said rotatable means, said shading means being so constructed and arranged with respect to said sectors and rotatable means that a maximum effect of said shading means upon the inductance of said spiral winding is produced simultaneously with the effective transfer of contact of said rotatable means from said first sector to said second sector, means coupling said rotatable means and a free end portion of said second sector to said source of energy, and means for adjusting said shading means relative to said rotatable contacting means and with respect to said winding in said transfer position of the contacting means whereby effective tracking over the operating range of said second metallic sector is accomplished.

10. A tuner for a circuit operable in response to high frequency radiant energy including video signals comprising fixed high frequency current conducting means a portion of which is tapered, fixed relatively low frequency conducting means, said latter means including a curved conductor of less than one turn aligned with but separated from the low band end of said tapered portion of said conducting means by a gap, said fixed conducting means being respectively coupled together by a portion of said low frequency conducting means, and shunt means including angularly movable contacting means for shunting predetermined high frequency signals away from said low frequency conducting means, said shunt means including a coil shading device coupled to said contacting means and so constructed and arranged as to shade at least a portion of said low frequency conducting means during the tuning of said circuit to relatively low frequency signals, said latter signals carried by both said conducting means including at least the lowest frequency band of said video signals.

11. A tuner comprising a base member, a tapered conductor fixed to said member and adapted to produce continuous linear tuning of a circuit subjected to relatively high frequencies, another conductor fixed to said base member and having an end spaced from the smaller end of said tapered conductor in opposite relation, a flat spiral coil fixed to said member adjacent said opposite ends of said conductors, one end of said coil being connected to one end of said opposite conductor ends and the other coil end being connected to the other one of said opposite conductor ends, and a combined contactor and coil shading blade device movably mounted in said base member, said contactor being constructed and arranged to contact both said conductors during a minimum relative movement thereof including the bridging of said conductors, said shading blade being constructed and arranged for movement near said coil to produce no electrical effect upon said tapered conductor but a maximum change in the inductance of said coil substantially at the time said contactor bridges said conductors whereby said circuit is tunable over a spectrum of frequencies widely separated by a so-called "dead" range without significant lost motion of said combined contactor and shading blade, continued movement of said blade spaced over said coil producing a gradual change in the inductance thereof whereby said circuit is tunable to a lower band of said frequencies.

12. A tuner for a circuit responsive to relatively high frequency signals from a radiant energy source, comprising a high frequency band sector of tapered form and an aligned low frequency band sector formed from a single piece of conductive material, a backing member for said sectors, said sectors being joined by at least one web severable therefrom after mounting on said member to produce at least one gap corresponding to a distinct tuning transition point, a coil having at least one turn mounted on said member and electrically connecting an end of one of said sectors formed by said web severance to an end of the other sector likewise formed to produce a continuous conductor, means including a rotatable contactor and a shading coil blade mounted on said backing member for electrically shunting at least a portion of said continuous conductor dependent upon the divergence of the frequency to which said circuit is tuned from a predetermined reference signal, and means for coupling said continuous conductor to said source, said shading coil being so shaped and correlated with said contactor as to be effective to gradually alter the inductance of said coil only in predetermined positions of said contactor on said low band sector, the maximum change of inductance of said coil being produced during the period of said contactor bridging said gap whereby said tuning transition point is effected.

13. A tuner for tuning a circuit to frequencies separated by a so-called "dead" range comprising a tapered metallic sector having one end thereof representing the high portion of said frequencies adapted to be connected to a source of radiant energy, a uniform metallic sector aligned with said tapered sector and having one end thereof spaced in opposed position from an end of said tapered sector remote from said high frequency portion thereof, a flat spiral coil arranged within an area substantially enclosed by said sectors and adjacent said spaced ends, means connecting the ends of said spiral to said opposed ends of the sectors to produce a continuous conductor including said sectors, the end of said uniform sector remote from said coil being connected to said source of radiant energy, mounting means for said sectors and coil, a combined contactor and eddy current blade unit insulatively and rotatively arranged on said mounting means, said contactor being adapted to contact both said sectors during less than one turn of said unit, said blade being so constructed and arranged with respect to said sectors and said coil that a maximum inductance canceling effect is produced as said contactor bridges said sectors, continued rotation of said unit away from said tapered sector producing uniformally less inductance canceling effect to a final negligible effect at the lowest frequency, and means connecting said unit to the power connected end of said uniform sector.

14. In a tuner for a circuit energized by high frequency signals in at least two widely separated groups of radiant energy broadcasting channels, the combination comprising at least two curved conducting members having severable webs therebetween and formed from a single piece of material, each of said members including an integrally formed terminal at each end thereof, insulative support means for said members, one of said webs when severed creating a space between said members designated as a "dead" signal range, a coil mounted on said support means adjacent said space and electrically interposed between said members through the integrally formed terminals near said space, one of said curved members having such changing sectional form throughout its length as to be adapted for tuning said circuit to a high frequency band of signals, the other curved member being substantially uniform, an angularly movable contacting device adjustably mounted to said support means in a centralized position with respect to said members, fixed conductive means including a portion in a slidable contact relation with a portion of said contacting device and interposed between an end of said other pair of members remote from said space and said device, and an absorption plate coupled to said device in a predetermined spaced arrangement with respect to said coil when said contact device is in a position to bridge said members, said plate being of such form as to substantially cover a major surface of said coil in said contactor position.

CLEON F. FREY, Jr.
ROBERT J. AUST.

No references cited.